(12) United States Patent
Gutmann et al.

(10) Patent No.: US 8,715,909 B2
(45) Date of Patent: May 6, 2014

(54) LITHOGRAPHY SYSTEMS AND METHODS OF MANUFACTURING USING THEREOF

(75) Inventors: Alois Gutmann, Poughkeepsie, NY (US); Henning Haffner, Pawling, NY (US); Sajan Marokkey, Wappinger Falls, NY (US); Chandrasekhar Sarma, Poughkeepsie, NY (US); Roderick Koehle, Ottobrunn (DE)

(73) Assignee: Infineon Technologies AG, Neubiberg (DE)

( * ) Notice: Subject to any disclaimer, the term of this patent is extended or adjusted under 35 U.S.C. 154(b) by 1399 days.

(21) Appl. No.: 11/868,374

(22) Filed: Oct. 5, 2007

(65) Prior Publication Data
US 2009/0092926 A1   Apr. 9, 2009

(51) Int. Cl.
*G03F 7/20* (2006.01)

(52) U.S. Cl.
USPC ........................................................ 430/311

(58) Field of Classification Search
USPC ..................................................... 430/5, 311
See application file for complete search history.

(56) References Cited

U.S. PATENT DOCUMENTS

| | | | |
|---|---|---|---|
| 4,595,295 A | 6/1986 | Wilczynski | |
| 4,980,896 A | 12/1990 | Forsyth et al. | |
| 5,194,893 A | 3/1993 | Nishi | |
| 5,415,835 A | 5/1995 | Brueck et al. | |
| 5,673,103 A | 9/1997 | Inoue et al. | |
| 6,042,998 A | 3/2000 | Brueck et al. | |
| 6,048,647 A | 4/2000 | Miyazaki et al. | |
| 6,134,008 A | 10/2000 | Nakao | |
| 6,172,752 B1 | 1/2001 | Haruna et al. | |
| 6,201,609 B1 | 3/2001 | Hill et al. | |
| 6,233,044 B1 | 5/2001 | Brueck et al. | |
| 6,392,740 B1 | 5/2002 | Shiraishi et al. | |
| 6,400,794 B1 | 6/2002 | Schultz et al. | |
| 6,452,662 B2 | 9/2002 | Mulkens et al. | |
| 6,563,564 B2 | 5/2003 | de Mol et al. | |
| 6,650,399 B2 | 11/2003 | Baselmans et al. | |
| 6,683,710 B2 | 1/2004 | Hoffman et al. | |
| 6,700,646 B2 | 3/2004 | Mulkens et al. | |
| 6,714,282 B2 | 3/2004 | Inoue | |
| 6,717,722 B2 | 4/2004 | Shafer et al. | |

(Continued)

FOREIGN PATENT DOCUMENTS

EP  0 949 541 A2  4/1999
EP  1 037 117 A2  2/2000

(Continued)

OTHER PUBLICATIONS

Maldonado, J.R., et al., "A Raster Multibeam Lithography Tool for Sub 100nm Mask Fabrication Utilizing a Novel Photocathode," Proceedings of SPIE, Nanofabncation Technologies, 2003, vol. 5220, pp. 46-51.

(Continued)

*Primary Examiner* — Brittany Raymond
(74) *Attorney, Agent, or Firm* — Slater & Matsil, L.L.P.

(57) ABSTRACT

Multi-beam lithography systems and methods of manufacturing semiconductor devices using the same are disclosed. For example, the method utilizes non-coincidence of boundaries of electrical fields emanating from chrome on glass or phase shifted mask features distributed over two masks for the optimization of lithographic process windows, side lobe suppression, or pattern orientation dependent process window optimization employing one mask with polarization rotating film on the backside.

23 Claims, 6 Drawing Sheets

(56) References Cited

U.S. PATENT DOCUMENTS

| | | | |
|---|---|---|---|
| 6,724,464 B2 | 4/2004 | Yang et al. | |
| 6,753,947 B2 | 6/2004 | Meisburger et al. | |
| 6,753,954 B2 | 6/2004 | Chen | |
| 6,757,066 B2 | 6/2004 | Hill | |
| 6,791,693 B2 | 9/2004 | Hill | |
| 6,795,168 B2 | 9/2004 | Wang et al. | |
| 6,806,962 B2 | 10/2004 | Hill | |
| 6,819,425 B2 | 11/2004 | Kwan | |
| 6,819,434 B2 | 11/2004 | Hill | |
| 6,847,452 B2 | 1/2005 | Hill | |
| H2114 H | 2/2005 | Novak et al. | |
| 6,859,515 B2 | 2/2005 | Schultz et al. | |
| 6,894,762 B1 | 5/2005 | Berman et al. | |
| 6,947,192 B2 | 9/2005 | Hoffman et al. | |
| 6,967,711 B2 | 11/2005 | Gui | |
| 6,985,286 B2 | 1/2006 | Shafer et al. | |
| 6,989,546 B2 | 1/2006 | Loschner et al. | |
| 7,030,966 B2 | 4/2006 | Hansen | |
| 7,030,994 B2 | 4/2006 | Hill | |
| 7,046,370 B2 | 5/2006 | Carlson | |
| 7,057,739 B2 | 6/2006 | Hill | |
| 7,061,583 B2 | 6/2006 | Mulkens et al. | |
| 7,084,960 B2 | 8/2006 | Schenker et al. | |
| 7,116,404 B2 | 10/2006 | Lof et al. | |
| 7,138,212 B2 | 11/2006 | Hsu et al. | |
| 7,148,495 B2 | 12/2006 | Schultz et al. | |
| 7,172,838 B2 | 2/2007 | Maurer et al. | |
| 7,180,576 B2 | 2/2007 | Hansen | |
| 7,244,665 B2 | 7/2007 | Benson | |
| 7,289,212 B2 | 10/2007 | Kwan | |
| 7,321,432 B2 | 1/2008 | Hill | |
| 7,321,433 B2 | 1/2008 | Larsen et al. | |
| 2001/0001247 A1 | 5/2001 | Finders et al. | |
| 2001/0046038 A1 | 11/2001 | Mulkens et al. | |
| 2002/0045136 A1* | 4/2002 | Fritze et al. | 430/322 |
| 2002/0167653 A1 | 11/2002 | Mulkens et al. | |
| 2003/0027366 A1* | 2/2003 | Dulman et al. | 438/16 |
| 2003/0117598 A1* | 6/2003 | Case et al. | 355/53 |
| 2003/0162102 A1 | 8/2003 | Pierrat | |
| 2005/0130340 A1* | 6/2005 | Beaulieu et al. | 438/57 |
| 2005/0136340 A1 | 6/2005 | Baselmans et al. | |
| 2005/0151951 A1 | 7/2005 | Hill | |
| 2006/0158633 A1 | 7/2006 | Mackey et al. | |
| 2006/0203214 A1 | 9/2006 | Shiraishi | |
| 2006/0268248 A1 | 11/2006 | Noelscher | |
| 2007/0008547 A1 | 1/2007 | Hill et al. | |
| 2007/0273854 A1 | 11/2007 | Nagasaka | |
| 2008/0119048 A1 | 5/2008 | Sarma et al. | |
| 2008/0225260 A1* | 9/2008 | Klaassen et al. | 355/71 |

FOREIGN PATENT DOCUMENTS

| | | |
|---|---|---|
| EP | 1 231 513 A1 | 2/2001 |
| EP | 1 233 304 A1 | 2/2001 |
| EP | 1 164 436 A2 | 6/2001 |
| EP | 1 182 509 A2 | 8/2001 |
| EP | 1 231 517 A1 | 2/2002 |
| EP | 1 235 114 A1 | 2/2002 |
| EP | 1 286 218 A2 | 8/2002 |
| EP | 1 473 596 A2 | 2/2004 |
| EP | 1 681 710 A1 | 10/2004 |

OTHER PUBLICATIONS

Lai, N. D., et al., "Fabrication of Two- and Three-Dimensional Periodic Structures by Multi-Exposure of Two-Beam Interference Technique," Optics Express, vol. 13, No. 23, Nov. 14, 2005, pp. 9605-9611.

Solak, H. H., et al., "Multiple Beam Interference Lithography in the EUV and Visible Regions," PSI Annual Report 2001, Laboratory for Micro- and Nanotechnology, Paul Scherrer Institut, Villigen PSI, Switzerland, 1 page.

* cited by examiner

LITHOGRAPHY SYSTEMS AND METHODS OF MANUFACTURING USING THEREOF

TECHNICAL FIELD

The present invention relates generally to the fabrication of semiconductor devices, and more particularly to lithography systems used to pattern material layers of semiconductor devices.

BACKGROUND

Generally, semiconductor devices are used in a variety of electronic applications, such as computers, cellular phones, personal computing devices, and many other applications. Home, industrial, and automotive devices that in the past comprised only mechanical components now have electronic parts that require semiconductor devices, for example.

Semiconductor devices are manufactured by depositing many different types of material layers over a semiconductor workpiece or wafer, and patterning the various material layers using lithography. The material layers typically comprise thin films of conductive, semiconductive, and insulating materials that are patterned and etched to form integrated circuits (ICs). There may be a plurality of transistors, memory devices, switches, conductive lines, diodes, capacitors, logic circuits, and other electronic components formed on a single die or chip, for example.

Optical photolithography involves projecting or transmitting light through a pattern comprising optically opaque areas and optically clear or transparent areas on a mask or reticle. For many years in the semiconductor industry, optical lithography techniques such as contact printing, proximity printing, and projection printing have been used to pattern material layers of integrated circuits. Lens projection systems and transmission lithography masks are used for patterning, wherein light is passed through the lithography mask to impinge upon a photosensitive material layer disposed on a semiconductor wafer or workpiece. After development, the photosensitive material layer is then used as a mask to pattern an underlying material layer. The patterned material layers comprise electronic components of the semiconductor device.

There is a trend in the semiconductor industry towards scaling down the size of integrated circuits to meet the demands of increased performance and smaller device size. However, as features of semiconductor devices become smaller, it becomes more difficult to pattern the various material layers because of diffraction and other effects that occur during a lithography process. For example, key metrics such as resolution and depth of focus of the imaging systems may suffer when patterning features at small dimensions.

A number of next generation techniques are being pursued to overcome these limitations, but most of them use different imaging techniques, tools, and technology. Abandoning more than 25 years of learning and development in optical lithography may not be cost effective and involves tremendous risks.

What are needed in the art are lithography systems and methods of manufacture thereof that overcome these limitations, while still retaining the benefits of current lithography tools and techniques.

SUMMARY OF THE INVENTION

These and other problems are generally solved or circumvented, and technical advantages are generally achieved, by embodiments of the present invention which provide lithography masks and methods of manufacture thereof.

In accordance with an embodiment of the present invention, a method for forming a pattern on a semiconductor body includes simultaneously exposing a first mask and a second mask, the first mask comprising transparent regions bounded by opaque regions and the second mask comprising transparent regions bounded by phase shift regions. Boundaries of the pattern are formed by a superposition of a first light exposed by the transparent regions of the first mask with a second light exposed by the phase shift regions of the second mask.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIG. 5, which includes

FIG. 7, which includes FIG. 8 includes FIGS. 8a and 8b, wherein

Corresponding numerals and symbols in the different figures generally refer to corresponding parts unless otherwise

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Embodiments of the present invention achieve technical advantages by providing methods of manufacturing using a lithography system, wherein two or more coherent optical beams passing through independent masks constructively or destructively interfere to form patterns. In various embodiments, the method utilizes non-coincidence of boundaries of electrical fields emanating from chrome on glass or phase shifted mask features distributed over two masks for the optimization of lithographic process windows, side lobe suppression, or pattern orientation dependent process window optimization employing one mask with polarization rotating film on the backside.

The resolution R of an optical lithography system is generally related to a ratio of the optical wavelength λ of the radiation used for exposure to the numerical aperture NA of the optical system used to direct radiation from an irradiated mask to the wafer (or $R=k_1\lambda/NA$). Thus, increases in basic resolution require decreases in wavelength or increases in optical system numerical aperture. However, shorter illumination wavelengths cannot use many convenient optical materials, as suitable refractive optical materials are unavailable. Increases in optical system numerical aperture are more difficult to achieve, and increased numerical aperture can reduce the tolerance of lithographic processes to defocus. Further, the $k_1$ factor depends on the imaging system, but has a theoretical limit of 0.25. Current lithography systems already operate around 0.3 and further reduction in this factor is difficult.

One way of overcoming this barrier is to use multi-beam coherent interference lithography. In various embodiments, the current invention uses multi-beam coherent interference lithography to improve printing resolution, while utilizing current optical lithography equipments, possibly with minimal modifications.

Figure 1:
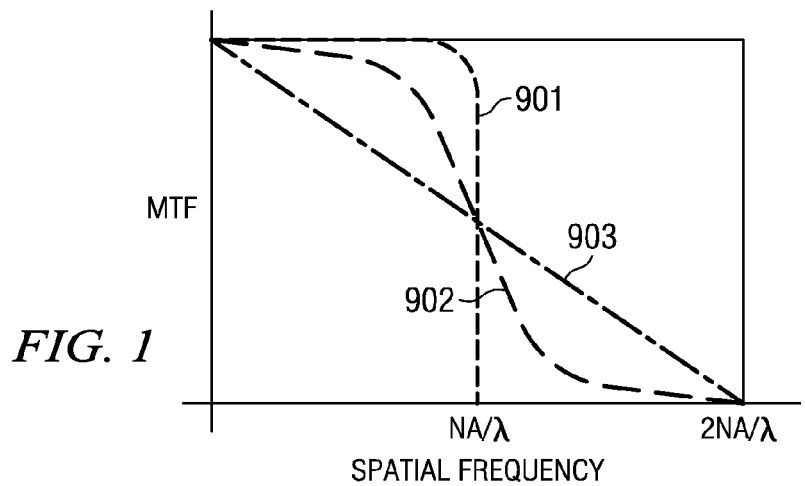
FIG. 1 illustrates the advantage of using coherent illumination as used in various embodiments of the current invention.

The resolution of multi-beam coherent interference lithography is much higher than that of optical lithography allowing printing of critical dimensions of about λ/4. FIG. 1 is used to illustrate the potential advantage of coherent interference lithography. The image contrast which in turn depends on a modulation transfer function MTF of the projection lens system of the lithography tool varies with the type of illumination used. Light passing through a mask is diffracted into a number of diffraction orders. The finite size of the entrance pupil of the projection lens system allows only the lowest few diffraction orders to pass through the projection lens system and recombine to form the image on the wafer.

The MTF defines the efficiency of transfer of the higher order components of the diffracted light. Consequently, a loss of higher order diffracted light can result in loss in image quality. FIG. 1 shows the MTF as a function of spatial frequency (depends, for example, inversely on the width of the feature) for different illuminations.

In coherent illumination, all the elementary waves in each optical beam have a constant phase difference in space and time. For a system using coherent illumination (shown in FIG. 1 as curve 901), the MTF is a delta function with spatial frequency. Hence, although coherent illumination improves contrast, printing of finer features is significantly eroded due to a fall-off in the modulation transfer function beyond NA/λ. At the other extreme, incoherent illumination 903 lacks the contrast needed to print images. Hence, partial coherence 902 is predominantly adopted in imaging fine features by the semiconductor industry.

The present invention will be described with respect to preferred embodiments in a specific context, namely coherent lithography systems and methods of using it, applied to semiconductor device manufacturing. The invention may also be applied, however, to the printing of other small devices and structures. For example, the invention may also be applied to pattern other types of devices in other applications and other technological fields.

Figure 2:
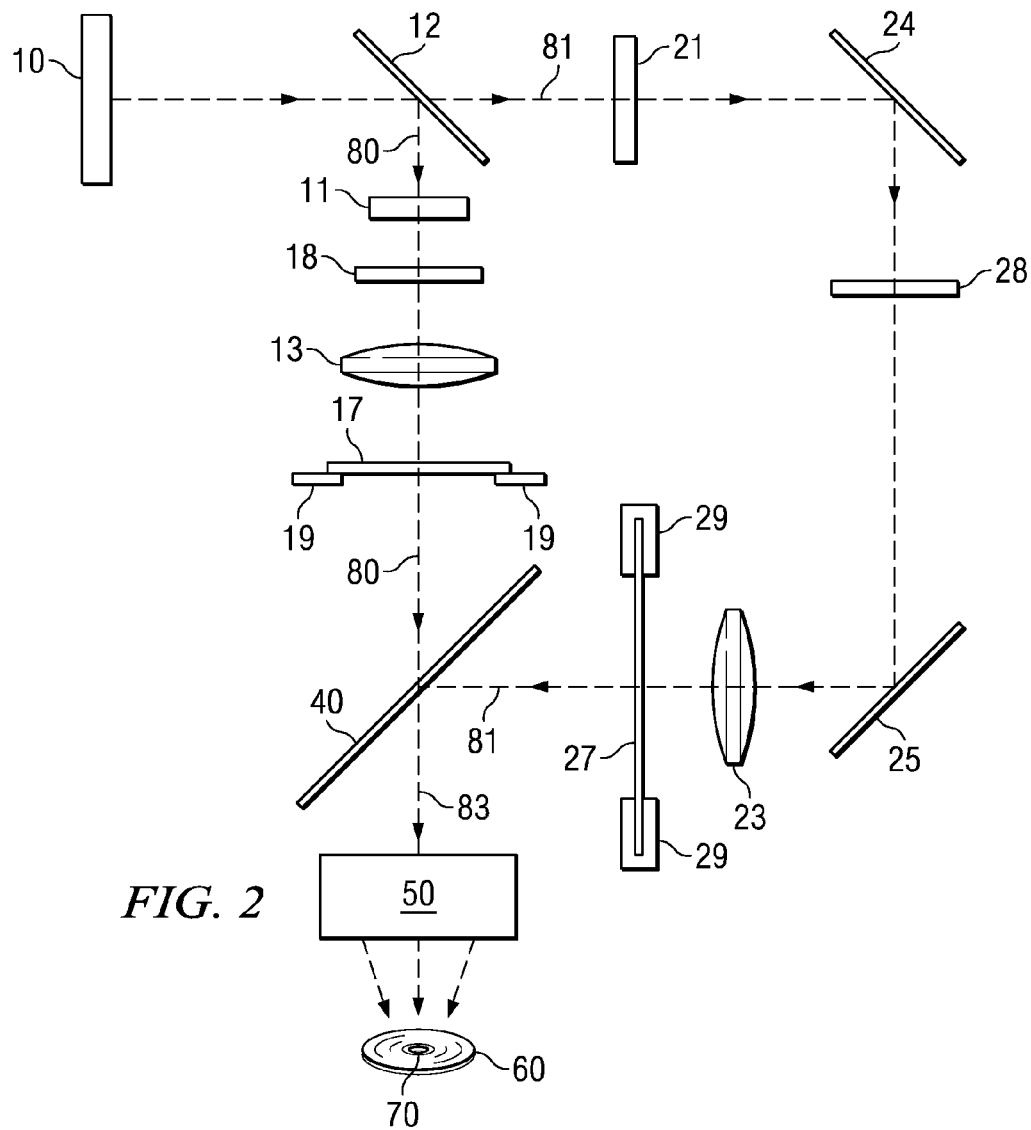
FIG. 2 illustrates a lithography system in accordance with an embodiment of the current invention.

A coherent lithography system described by an embodiment of the current invention is shown in FIG. 2. A mask using embodiments of the current invention will then be described using FIG. 3. Various embodiments of the current invention, to generate masks for the lithography systems for different design features, will be described using the flow chart of FIG. 4 and FIGS. 5-7. Further, FIG. 8 describes the use of embodiments of the current invention in forming semiconductor devices.

As shown in FIG. 2, the lithography system comprises: an illuminator system comprising illuminator 10, polarizers 11 and 21, absorption filters 18 and 28, condenser lenses, diffractive optical elements 13 and 23, mask or reticle stages 19 and 29 for holding the masks 17 and 27, projection lens system 50, and a workpiece holder 60 for holding a wafer or workpiece 70.

Referring to FIG. 2, the illuminator 10 provides light with suitable optical characteristics such as wavelength, intensity, coherence, etc. For example, the illuminator 10 may emit a single wavelength of coherent light such as from a laser source. A specific example of such a laser source is ArF, an excimer laser, which produces light with a wavelength of 193 nm. In various embodiments, the illuminator 10 emits near ultraviolet (UV) or preferably deep ultraviolet (UV) light; e.g., light with wavelengths of 248 nm, 193 nm or 157 nm, although light having other wavelengths may also be used. In different embodiments, other lasers and wavelengths are possible. The illuminator 10 may comprise a pulsed laser or a continuous wave laser. The illuminator 10 may be individually controlled to optimize the characteristics of the exiting light radiation. For example, the light intensity, dose, pulse width or time of exposure may be separately modulated by the illuminators.

The optical beam generated by the illuminator 10 is split by a non-polarizing beam splitter 12, although in some embodiments the beam splitter 12 may comprise a polarizer. The beam splitter 12 generates first and second optical beams 80 and 81. The first optical beam 80 passes through a polarizer 11, whereas the second optical beam 81 passes through a different polarizer 21.

A light of a single wavelength consists of an electromagnetic field in which electric fields and magnetic fields oscillate at a defined frequency. However, the electric field is unrestricted in that it exists in a plurality of directions relative to the direction of propagation of light. After passing through the polarizers 11 and 21, only particular electric field and magnetic field oscillations remain. In some embodiments, the first and second optical beams 80 and 81 are orthogonally polarized, although in other embodiments they may be non-orthogonal. Further, in some embodiments, only the transverse electric (TE) and transverse magnetic (TM) modes are used. In other embodiments, only linearly polarized light beams may be used wherein the electric field and magnetic field are oriented along only one single direction. For example, the polarized light may comprise a vertically polarized ("V") light in which the electric field is restricted to lie along the z-axis for a light propagating along the x-axis, and similarly a horizontally polarized ("H") light in which the electric field lies along the y-axis.

The optical beam 81 is further reflected by mirrors 24 and 25 and redirected back as shown in FIG. 2. The optical paths for the first and second optical beams 80 and 81 may be specifically controlled to enable constructive or destructive interference. One way of changing the interference pattern between the first and second beams 80 and 81 is to use absorption filters 18 and 28. The absorption filters 18 and 28 may independently control the optical intensity of each optical beam by changing the transmission. In some embodiments, the absorption filters 18 and 28 may also include phase shifters to shift the phase of the first optical beam 80 or second optical beam 81. For example, the phase of each of the first and second optical beams 80 and 81 may be modulated to obtain a phase difference by $\pm 2n\pi$ radians (i.e., no phase difference) between the two optical paths. In various embodiments, the first optical beam 80 and/or the second optical beam 81 may be altered to produce a phase difference between the two beams in multiples of about $(2n-1)\pi$ radians, for example, to enable destructive interference. However, in some embodiments, the optical path of the first optical beam 80 and/or the second optical beam 81 may be altered to produce a phase difference between the two beams in multiples of about $(2n\pi + \pi/2)$ radians.

In various embodiments, the phase of one of the optical beams 80 and 81 may be shifted by other values to optimize the interference pattern. For example, layout effects arising, for example, from light scattering around trench sidewalls of alternating PSM mask features may be minimized by shifting the optical path of either or both first and second optical beams 80 and 81. In such embodiments, either one or both first and second optical beams 80 and 81 may be shifted in a smaller range. For example, one of the optical beams 80 and 81 may be phase shifted by about ±10 degrees.

Further, the first optical beam 80 and the second optical beam 81 may pass through conventional auxiliary elements such as a condenser lens system (not shown). The condenser (not shown) directs the first and the second optical beams 80 and 81 to diffractive optical elements (DOEs) 13 and 23.

The DOEs 13 and 23 may be two dimensional periodic and/or quasi-periodic arrays of micro optical elements which use diffraction and/or refraction to control wave fronts of the first and the second optical beams 80 and 81. The DOEs 13 and 23 may include binary optics, diffraction gratings, surface relief diffractive elements, Fresnel lenses, holographic optical elements and other designs that rely on diffraction for their primary optical properties and/or may use refraction as in a conventional optical element. The DOEs 13 and 23 may comprise any element which uses substrates or elements of transparent materials having amplitude and/or phase modulation or patterns which generate distinct amplitude, phase, and intensity patterns at specified fields or spatial positions. Similarly, DOEs 13 and 23 may, in some embodiments, comprise diffusive optical elements which reduce the directionality of the first and the second optical beams 80 and 81 by generating the effect of a large number of apparent secondary sources.

Further, the DOEs 13 and 23 generate desirable illumination distributions of the first and the second optical beams 80 and 81 on the masks 17 and 27 for different photolithographic imaging situations. Off-axis illumination distributions are used to enhance resolution by limiting the interference patterns. For example, the normally incident zero order or un-diffracted beam may be blocked by tilting the beam angle. Features, smaller than the diffraction limited frequency, transmit un-diffracted light. This un-diffracted light adds to the diffracted zero order light and reduces image contrast. Off-axis illumination shifts this un-diffracted light and improves image contrast. For example, using off-axis illumination, image formation occurs by the interference of beams from the zero order and either the +1 or −1 order diffracted beam. This off-axis illumination distribution of the first and the second optical beams 80 and 81 may comprise annular illumination, dipole, quadrupole illumination, and/or combinations thereof. In a conventional illumination, uniform circular patterns illuminate the masks 17 and 27. In an annular illumination, annular illumination patterns illuminate the masks 17 and 27. Finally, a quadrupole illumination comprises forming four separate circular illumination patterns. Consequently, in different embodiments the first and the second optical beams 80 and 81 may comprise different types of illuminations.

The illuminator system may also change the transmittance of either the first optical beam 80 or the second optical beam 81 in some embodiments to create, for example, a weak phase shift effect. In such cases, one of the beams may have a relative transmitted intensity of about 5% to about 30%.

The lithography system is set up in such a way that the first optical beam 80 passes through a first mask 17 positioned on a mask stage or first reticle stage 19 and enters the beam splitter 40. The second optical beam 81 similarly enters the second mask 27 positioned on a mask stage or reticle stage 29 and enters the beam splitter 40. The beam splitter 40 is, preferably, a non-polarizing beam splitter. The beam splitter 40 combines the first optical beam 80 and the second optical beam 81 and creates a composite optical beam 83. The composite optical beam 83 having passed through the two separate masks 17 and 27 contains optical information to form a final composite image on a semiconductor device or workpiece 70.

The first and second masks 17 and 27 may comprise any type of masks. For example, in various embodiments, the first mask 17 may be a binary mask, an attenuated phase shift mask, an alternating mask, etc. Similarly, the second mask 27 may be a binary mask, an attenuated phase shift mask, an alternating phase shifting mask, etc. In various embodiments, the lithography system may be adapted for enhancing the imaging system further.

Suitable modifications to the optical path of the first optical beam 80 and the second optical beam 81 may be introduced to improve the final composite image by changing either the first optical beam 80 or the second optical beam 81 or in some cases both beams.

The lithography system further includes a support or stage 60 for a semiconductor device or workpiece 70 and a common projection lens system 50 disposed proximate the semiconductor device 70 and support 60, as shown in FIG. 2. The projection lens system 50 may include a plurality of lenses (not shown), and may include a fluid disposed between the semiconductor device 70 mounted on the support 60 and a last lens of the projection lens system 50, e.g., in an immersion lithography system. The lithography system may comprise a stepper, wherein the stage 60 may be adapted to move the semiconductor device 70 while the masks 17 and 27 are held stationary during the exposure process, for example. In various embodiments, the lithography system may comprise a step-and-scan apparatus, wherein the stage 60 and reticle stages 19 and 29 are adapted to move during the exposure process, for example. The lithography system may also be adapted for immersion lithography applications, for example.

The lithography system also comprises a feedback mechanism or self-monitor (not shown) to test the optical integrity of the exposure tool. The optical test may include optical characteristics such as path difference, intensity difference between the various optical paths, and misalignment between various components of the tool including the masks. The reticle stages 19 and 29 may, for example, be adapted to include alignment systems that measure the relative position of the masks 17 and 27 mounted on them. For example, before processing a batch of semiconductor wafers, the lithography system may perform an automated self-check. Based on the feed-back from this self-check, various components of the lithography system can be adjusted, for example, to minimize the phase difference between optical beams or to minimize mask alignment errors.

The first mask 17 and the second mask 27 may have additional features for testing the alignment of the masks and/or the optical characteristics of the optical beam. These patterns may appear on the wafer as a test pattern.

In various embodiments, the illumination system may comprise more than one illuminator, and more than two masks and reticle stages.

As will be clear from other embodiments discussed below, the interference lithography tool can be employed in a variety of different configurations and applications. Further, other lithographic methods aimed at improving resolution may be combined with embodiments of the current invention. Examples include modification to light sources (e.g., Off-Axis Illumination), use of special masks for either or both masks, which exploit light interference phenomena (e.g., weak phase shift methods such as Attenuated Phase Shift Masks, or strong phase shift methods such as Alternating Phase Shift Masks, Chromeless Masks, etc.), and mask layout modifications (e.g., Optical Proximity Corrections).

An embodiment of a mask set using a lithography system comprising a dual mask setup will now be described using FIG. 3, followed by a method of designing the mask set using the flow chart of FIG. 4. Various embodiments of the mask set used in the lithography system will then be described using FIGS. 5-7. The various embodiments described by FIGS. 3-7 achieve advantageous results using interference of light beams and hence require a coherency between the light beams passing through the multiple masks.

Figure 3:
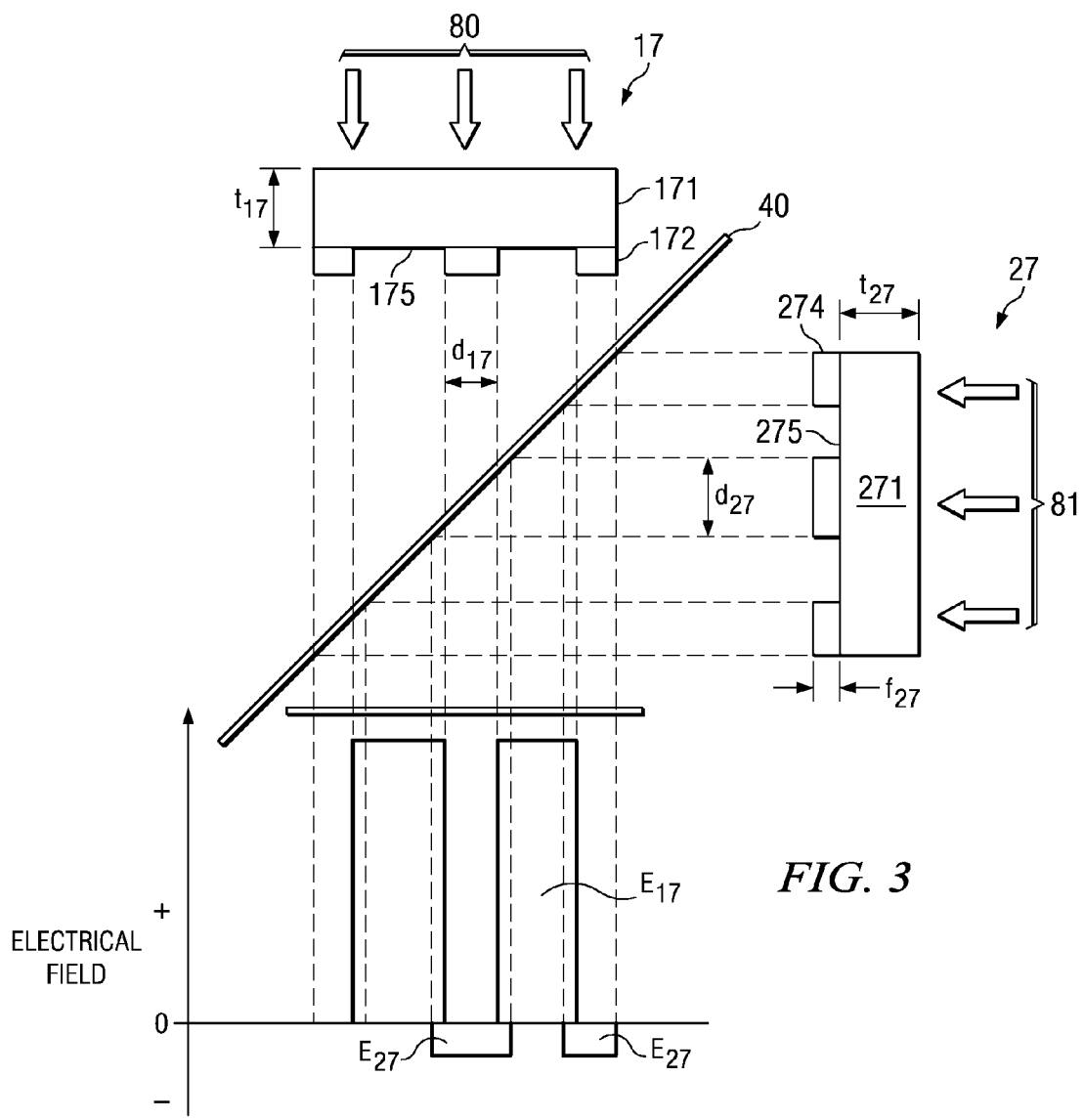
FIG. 3 illustrates masks used in a lithography system using an embodiment of the current invention.

Referring to FIG. 3, a first mask 17 and a second mask 27 are shown. In some embodiments, the first and second masks 17 and 27 are binary masks. In other embodiments, the first and second masks 17 and 27 may be any type of mask. The first mask 17 comprises a transparent layer 171 and an opaque layer 172. Similarly, the second mask comprises a transparent layer 271 and an attenuated phase shift material layer 274.

The transparent layers 171 and 271 of the masks 17 and 27 preferably comprise a transparent quartz layer, although in other embodiments they may comprise other materials, such as fluorinated quartz, calcium fluoride, hafnium oxide, borofloat, or sodalime glass, as examples.

The opaque layer 172 comprises an absorbing material or an absorber. The thicknesses of the opaque layer 172 are carefully selected to absorb most of the incident light. The opaque layer 172 preferably comprises chromium (Cr) in some embodiments, although alternatively, the opaque layer 172 may comprise other metals or metallic compounds such as Ta, TaN, Au, Ti, Ga, W, Ni, Sn, $SnO_2$, or other materials such as Si, Ge, C, and $Si_3N_4$. Similarly, the opaque layer 172 may be a single layer or a multi-layer stack. In some embodiments, the opaque layer 172 comprises a stack of chromium oxide on chromium. For example, in a specific embodiment, the opaque layer 172 may be a 5 nm chromium oxide ($Cr_2O_3$) film over a 70 nm chromium (Cr) film. The opaque layer 172 preferably comprises a thickness of about 50 nm to about 100 nm or less, although alternatively, the opaque layer 172 may comprise other dimensions. As is evident from the above discussion, any suitable material stack that has the correct combination of transmittance and refractive indices may be used to form the mask layers.

The phase shift material layer 274 may comprise a thickness $f_{27}$ that may be suitably adjusted to change the phase shift relative to a portion of the beam passing through a transparent part of the second mask 27. In some embodiments, the thickness $f_{27}$ of the attenuated phase shift material layer 274 is carefully selected to attain an optical path difference of about half the wavelength for light waves passing through the phase shifter relative to the light waves passing through the transparent region 271. This results in a phase difference of about 180 degrees between the waves. Further, the transmittance through the attenuated phase shift material layer 274 is selected to be about 4% to about 40% and preferably about 6%. Hence, the thickness $f_{27}$ of the attenuated phase shift material layer 274 is suitably selected based on both the wavelength of the incident light and the refractive index of the transparent region 271. In an alterative embodiment, any suitable refractive index of the chosen material may be used, thus widening the choices for suitable materials for layer 274. The required phase difference of 180° between the two optical paths is achieved by a direct phase adjustment of optical path 81. The attenuated phase shift material layer 274 preferably comprises a thickness of about 100 nm or less, and more preferably for use with a 193 nm incident light comprises a thickness of about 40 nm to about 60 nm. In some embodiments, the attenuated phase shift material layer 274 may comprise other dimensions. For example, the thickness of the attenuated phase shift material layer 274 may decrease if a lower wavelength, e.g., 157 nm, is used.

The attenuated phase shift material layer 274 preferably comprises an oxide of MoSi, although other materials may also be used. For example, in other embodiments, attenuated phase shift material layer 274 may comprise TaSiO, TiSiN, MoSiN, TaN, and/or ZrSiO. The attenuated phase shift material layer may either be a single layer or a multi-layer stack. For example, in an alternate embodiment, a multi-layer stack comprising TaN and $Si_3N_4$ or Mo and Si may be the attenuated phase shift material layer 274.

The thickness of the transparent regions 171 and 271 are $t_{17}$ and $t_{27}$, typically about ¼ inch. In some embodiments, the transparent regions 171 and 271 may be adjusted to introduce a phase difference between the optical beams 80 and 81.

The opaque layer 172 and the phase shift material layer 274 are patterned to form openings 175 and 275 on the masks 17 and 27, respectively. The openings 175 on the first mask 17 are separated by patterns of widths $d_{17}$, whereas openings 275 on the second mask 27 are separated by patterns of widths $d_{27}$. In the illustrated embodiment, the width $d_{27}$ of the second mask 27 is larger than the width $d_{17}$ of the first mask 17. However, in some embodiments, the width $d_{27}$ of the second mask 27 is smaller than the width $d_{17}$ of the first mask 17.

Optical beams passing through the first and second masks 17 and 27 pass through a beam splitter 40 and form a composite optical beam. The composite beam is formed by the interference of light from the first and second masks 17 and 27 due to differences in patterns in the masks and phase difference between the masks. Further modifications of interference may arise from objects in the optical path, such as absorption filters 18 and 28 (see FIG. 2), and variations in illuminations, etc.

The resulting electric field of the composite image comprises a superposition of the electric field $E_{17}$ of the optical beam 80 and electric field $E_{27}$ of the optical beam 81. The described method in various embodiments allows flexibility in choosing the different regions of the masks 17 and 27, for example, the widths $d_{17}$ and $d_{27}$ may be suitably selected to enhance the printing of the final features. Independent control of electric fields $E_{17}$ and $E_{27}$ enables optimization of final image quality such as image slope or lithographic process window. For example, electric fields $E_{17}$ and $E_{27}$ may be modified to allow a sharper transition in the intensity profiles. In various embodiments, both the location and shape of the attenuated phase shift material layer 274 in the second mask 27 may be independently selected.

The embodiment discussed above shows a decomposition of an attenuated phase shift mask into two masks whereby higher flexibility in independent parameter selection is gained at the expense of higher complexity as compared to the single mask attenuated PSM approach. However, in various embodiments, use of this technique enables the patterning of features formed using strong phase shifting techniques such as alternating phase shift masks. Hence, in various embodiments, the phase shift material layer 274 may either comprise a weak phase shift material or a strong phase shift material. In other words, the transmittance through the phase shift material layer 274 may vary between about 5% to about 100%.

Despite the potential possibility of forming an image using a large array of distinct phases, the complexity of forming these masks remains within conventional mask making ability. This is because unlike current technologies, the embodiments of the current invention use dual masks or perhaps even multiple masks to form a single image. Hence, each individual mask may be less complex than if only a single mask were used. In various embodiments, the current invention reduces the complexity of mask making, and/or significantly improves image resolution and process window.

A method of forming the mask set, comprising e.g., masks 17 and 27 shown in FIG. 2, using embodiments of the current invention will be described using the flow chart of FIG. 4.

A first mask 17 is selected to be a first mask type as shown in box b1. As discussed above the first mask 17 may be formed from any suitable mask type and may be formed from a suitable mask blank such as binary, tritone mask blanks. Similarly, the mask type of the second mask 27 is selected (box b2). A target layout is selected as shown in box b3. The target layout is decomposed into first and second masks 17 and 27 comprising a plurality of features (box b4). In different embodiments, the first and second masks 17 and 27 individually by themselves may not have the features of the target layout. As shown in the boxes b11 and b21, the optical characteristics of the first and second beams 80 and 81 are selected. The optical characteristics comprise intensity, wavelength, phase difference, polarization, illumination angle, etc. The mask features of the first and second masks 17 and 27 are determined. The features include all the openings (e.g., 175 and 275 in FIG. 2) and patterns on the first and second masks 17 and 27. The resulting characteristics (electric field, intensity, etc.) of the composite image formed by the interfering optical beams are calculated. Using these calculated intensities, critical dimensions on exposed photoresist are calculated. Based on the differences between the calculated critical dimensions and the target dimensions of the target features, an optimizer selects or modifies parameters of the optical characteristics of each optical beam. The optimizer would likely iterate the algorithm over a large number of iterations to sample the parameter space comprising the dimensions of the mask features and the optical characteristics of each optical beam 80 and 81. The optimizer may move up the flow chart if sufficient convergence is not reached. For example, the decomposition of the target layout into the two mask layout may be changed in subsequent iterations. Similarly, if the optimizer fails to converge, for example, if the target layout comprises complex features, a higher order mask type may be selected. For example, if the optimizer fails to converge using a binary mask, a tritone mask comprising three layers may be selected subsequently.

On successful convergence, the optimizer creates a data file (e.g., a GDS-II file) comprising the first mask 17 and the second mask 27, and the required optical process window to form the image. The first mask 17 and the second mask 27 after the optimization may comprise features for correcting optical proximity effects. For example, the first mask 17 and the second mask 27 may include sub resolution scatter bars, jogs, hammerheads, and serifs. Similarly, the optical process window for each optical beam comprises the type of illumination (conventional, dipole, annular, quadropole, etc.), polarizations, exposure intensity, dose, focus and pulse, and required phase shifters.

In various embodiments, the hierarchy shown in the flow chart may not be followed. For example, the order of precedence while changing parameters may be different than shown above. For example, in some embodiments, the optimizer may try to converge simultaneously using more or fewer parameters than discussed above.

Figure 4:
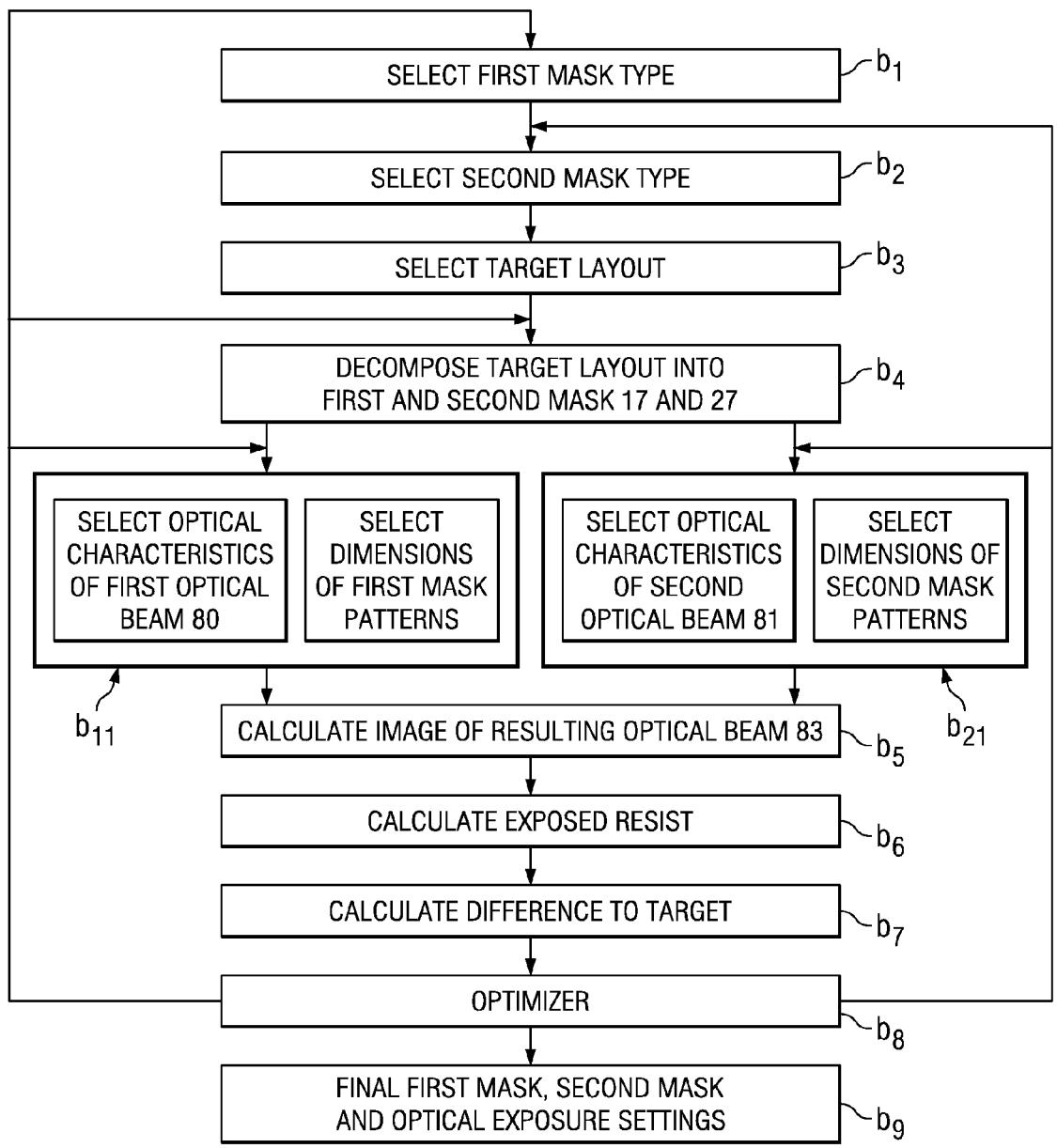
FIG. 4 illustrates a flow chart of a method of generating lithography masks for use with lithography systems, in accordance with an embodiment of the current invention.

The flow chart of FIG. 4 described above in various embodiments may be a software program or comprise a part of a larger software program.

Applications of embodiments of the current invention are described for a few illustrative cases. An embodiment will be described using FIG. 5, followed by various embodiments using FIGS. 6 and 7. In particular, FIG. 5 illustrates the use of embodiments of the current invention in forming optical proximity correction (OPC) features, FIG. 6 illustrates an embodiment using a backside film for selectively polarizing one of the optical paths, and FIG. 7 illustrates the use of an embodiment of the current invention in preventing side lobes formed during fabrication of contact holes.

Despite the use of OPC techniques, current process technologies impose a narrow process window especially with continued shrinking of geometries. The lithography system of e.g., FIG. 2 can be used to improve printing of features and to reduce the requirements of OPC features. A common feature used in OPC is called sub-resolution assist features (SRAFs). SRAFs serve to improve the printing of a plurality of main features by, for example, destructive interference of light passing through the main patterns. An exposure optimized for a first pitch may not be optimum for a second pitch. Hence, for example, SRAFs are typically introduced between gate lines of different pitches or openings. However, as pitches are scaled down, the addition of SRAFs becomes difficult.

Figure 5A:
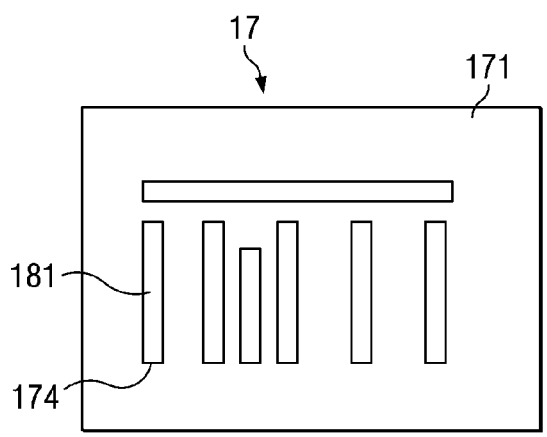
FIGS. 5a and 5b, illustrates an alternate method of generating lithography masks for use with the lithography systems, wherein the masks are separated based on feature density and/or OPC requirements, in accordance with an embodiment of the current invention.
Figure 5B:
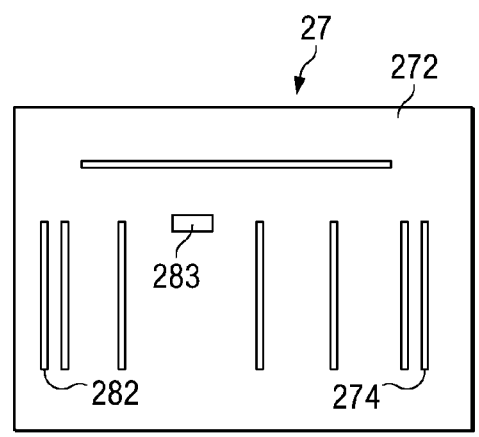
Figure 6:
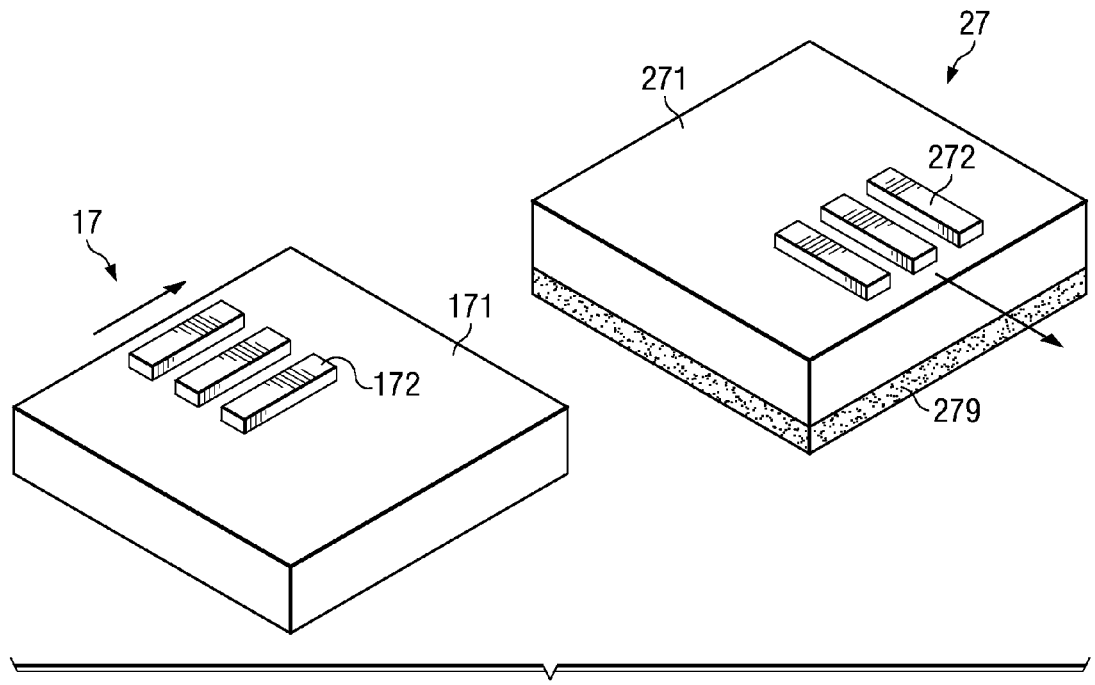
FIG. 6 illustrates an alternate method of generating lithography masks for use with lithography systems, wherein the masks are separated based on feature alignment, in accordance with an embodiment of the current invention.

Referring now to FIG. 5a, the first mask 17 comprises the first features 181 to be printed. The first features 181, for example, comprise regions of attenuated phase shift regions 174 embedded in transparent regions 171. Similarly, as illustrated in FIG. 5b, the second mask 27 comprises OPC features such as SRAFs vertical features 282 and lateral features 283. The second mask 27, for example, comprises a background opaque region 272, and the vertical features 282 and lateral features 283 comprise regions of attenuated phase shift material 274.

The final printed image contains only the first features 181 from the first mask 17. Hence, the primary features are formed on the first mask 17 and the secondary features are formed on the second mask 27. Such a scheme allows greater freedom in selecting and optimizing SRAFs. For example, lateral features 283 not allowed at tight pitches due to space constraints can be placed easily on the second mask 27. Greater flexibility in placement of OPC features enables improved OPC correction on the final image. Hence, the widest possible process window may be obtained by optimization of the OPC features between the two masks. For example, the size and shapes of SRAFs may be optimized independently.

An embodiment for selectively altering the interference patterns produced by the optical beams will now be discussed using FIG. 6. In this embodiment, the first mask 17 and the second mask 27 are generated by separating features aligned along different directions. In a typical integrated circuit chip, the features are aligned either laterally or vertically. Hence, the first mask 17 may comprise vertical features and the second mask 27 may comprise only lateral features.

Referring to FIG. 6, the first mask 17 comprises vertical features comprising opaque regions 172 embedded in a matrix of transparent regions 171. The vertical features may also be formed by attenuated phase shifter materials in some embodiments. The second mask 27 comprises lateral features comprising opaque regions 272 embedded in a matrix of transparent regions 271. The lateral features may also be formed by attenuated phase shifter materials in some embodiments. The second mask 27 further includes a polarizer rotating material layer 279 located on the back side of the second mask 27. The polarizer rotating material layer 279 changes the relative angle of the electric field relative to the direction of the propagation of the light. For example, the polarizer rotating material layer 279 rotates the polarization of incident light by 90 degrees. The plane of polarization may be individually rotated for every mask to achieve the widest lithographic process window for a given pattern direction. The thickness of the polarizer rotating material layer 279 may be suitably optimized. Transmittance requirements on the polarization rotating film may be fairly relaxed as any undesirable intensity loss due to absorption can always be compensated with an increase in incoming light intensity (for example, by proper balancing of light intensities between the first and second optical paths 80 and 81). On the other hand, for a single mask approach, selective placement of polarization rotating film over mask features dramatically increases complexity of mask fabrication. Moreover, for a single mask approach, high transmittance is required for the polarization rotating film material. Intensity loss through the polarization rotating film would have to be compensated by adjustments of mask feature sizes (as both mask portions covered with and free of polarization rotating film would be illuminated by uniform light intensity across the whole mask). Such problems do not arise with the two-mask approach described in FIG. 6, where deposition of a uniform layer of polarization rotating layer on one mask only could be carried out without technical or manufacturing difficulties.

An embodiment for prevention of side lobes will now be discussed using FIG. 7. Another challenge involves geometric scaling that relates to the printing of contact holes, and in particular regarding unwanted printing of features such as side lobes. Side lobes are typically formed due to unwanted exposure of resist layers when using an attenuated phase shift mask. In an attenuated phase shift mask, the incident light passing through a first region is phase shifted by about 180 degrees compared to a second neighboring region. The images from the two regions destructively interfere near the edge of the first and second regions and result in a clear separation between the images. Thus, the edge of the unexposed to the exposed region can be defined with higher precision. Ideally, the light passing through the first region is too low in intensity to expose the resist under the first region. However, when features are printed onto a wafer having a width near the resolution limit of the optical system, the intensity distribution in certain areas under the attenuated region may increase due to interference effects and expose the underlying resist. This results in the formation of unwanted side lobes near the main feature in the resist.

A number of solutions exist in the art for the removal of side lobes. For example, a second or additional pattern step may be used to cover the mask with opaque material at positions where undesired side lobe intensity would otherwise appear and thus avoid the unwanted side lobes. Hence, the mask design involves, for example, patterning a tritone mask into a rim type structure. Similarly, the use of this technique offers only limited capability for further optimization, as in a single mask such techniques are limited by the available geometries of the various regions. Using a dual mask scheme as described in various embodiments of the current invention allows greater flexibility in designing masks with improved immunity to side lobe formation. An example of this flexible design is described in an embodiment described by FIG. 7.

Figure 7A:
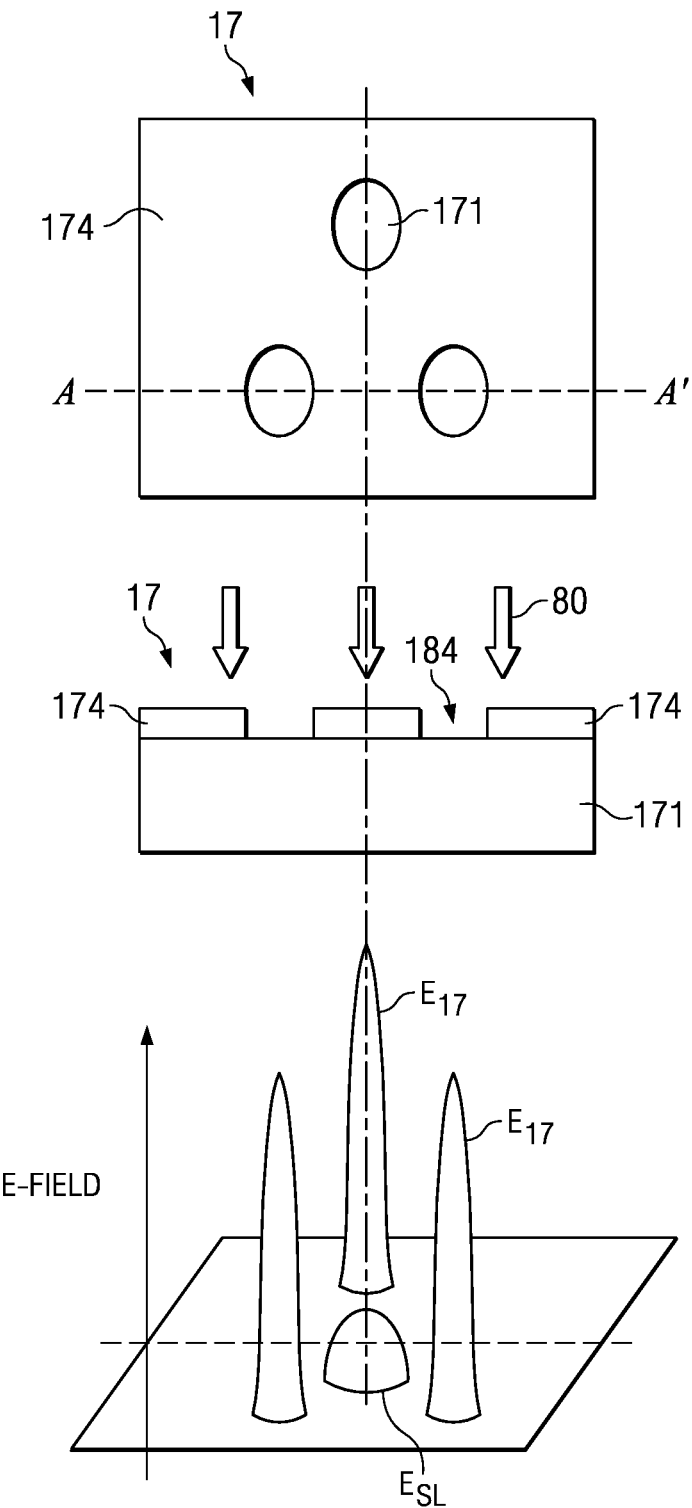
FIGS. 7a-7c, illustrates an alternate method of generating lithography masks for use with lithography systems, wherein the masks form contact holes while preventing formation of side lobes, in accordance with an embodiment of the current invention.

Referring now to FIG. 7a, the top figure illustrates the first mask 17 in a top view, whereas a cross-sectional view at line A-A' is illustrated by the middle figure. The first mask 17 comprises the third features 184 to be printed. The feature, for example, may be a contact hole. The first mask 17 comprises openings or third features 184 formed by transparent regions 171 and attenuated phase shift material layer 174. A first optical beam 80 passing through the first mask 17 forms the electric field distribution $E_{17}$ and $E_{SL}$. The electric field distributions $E_{17}$ are formed by openings 184 and print needed patterns on a semiconductor body. However, the electric field $E_{SL}$ is unwanted and forms deleterious patterns on the semiconductor body.

Figure 7B:
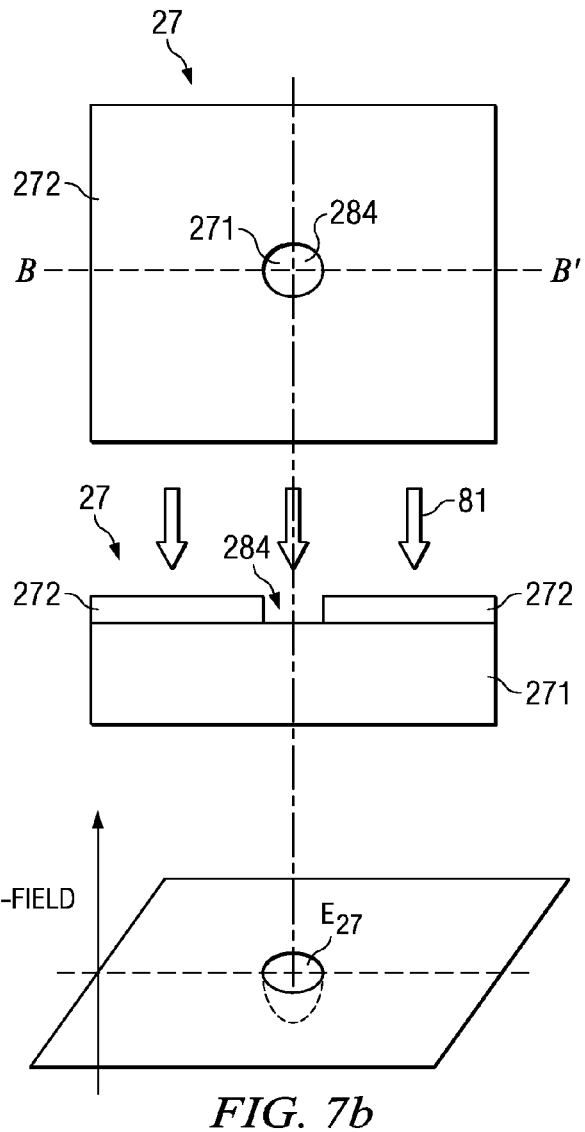

Referring to FIG. 7b, the top figure illustrates the second mask 27 in a top view, whereas a cross-sectional view at line B-B' is illustrated by the middle figure. The second mask 27 comprises assist holes 284 formed by transparent regions 271 embedded in a background of opaque regions 272. The electric field distribution $E_{27}$ of a second optical beam 81 passing through the second mask 27 is opposite to the electric field distribution $E_{17}$ or $E_{SL}$ from the first mask 17. The difference arises due to the phase difference between the optical beams 80 and 81. The optical beam 81 is phase shifted by 180 degrees using elements in the illumination lens system (for example, of FIG. 2).

Figure 7C:
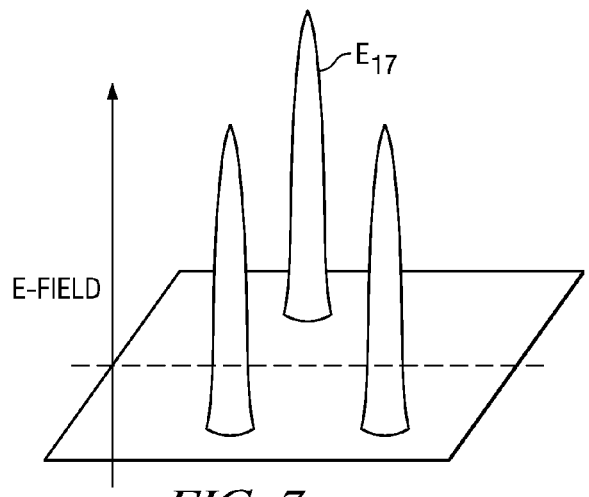

In a lithography system with simultaneous exposure of the two masks, this difference in electric fields results in a destructive interference around the assist holes 284. The resulting electric field is illustrated in FIG. 7c. The destructive interference removes the electric field distribution $E_{SL}$ associated with the formation of side lobes. The absence of electric field $E_{SL}$ results in printing contact holes without the associated side lobes.

Hence, this embodiment offers at least three distinct benefits unavailable using a single mask approach. First, the mask design for side lobe prevention is considerably simplified by avoiding complex structures typically used. Second, further optimization or improvement in contrast may follow by simple optimization of dimensions of the various layers. For example, the dimensions of assist holes 284 may be changed until the best optimum is found. Also, independent control of optical properties of the two light sources enables better co-optimization. For example, higher electric field intensity can be used when smaller assist holes 284 are used. Similarly, this technique allows greater flexibility in the first mask. For example, the phase shift material layer 174 may be less attenuated, for example, have a higher transmission value. Although a higher transmission value helps to improve contrast, it creates increased side lobe formation. By independently controlling the side lobe effect, the first mask may be tailored to improve contrast. Finally, this optimum can be performed on a local level. In other words, the dimensions of the assist holes 284 may be changed based on the features of the contact hole to be formed, but also on the neighboring features that may impact the interference patterns.

Figure 8A:
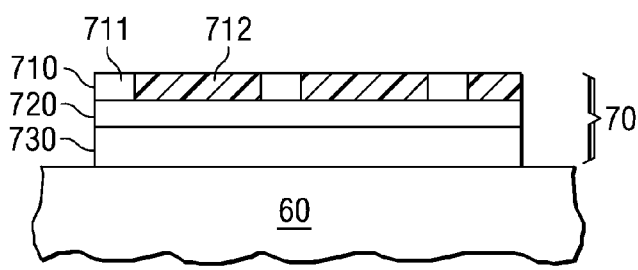
FIG. 8a shows a cross-sectional view of a semiconductor device that has a layer of photoresist disposed thereon that has been patterned using embodiments of the present invention.
Figure 8B:
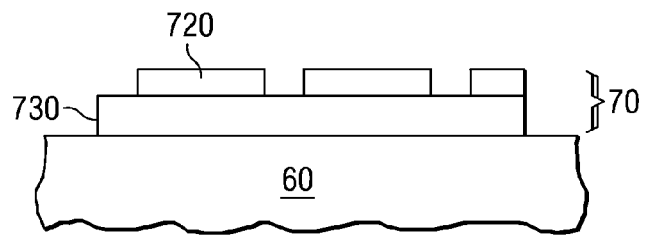
FIG. 8b shows the semiconductor device of FIG. 8a after the layer of photoresist has been used as a mask to pattern a material layer of the semiconductor device.

Embodiments of the present invention include methods of manufacturing semiconductor devices and devices manufactured using the lithography systems of FIG. 2 and mask sets in FIG. 3 or 4 described herein. FIG. 8*a* shows a cross-sectional view of a semiconductor device 70 that has a layer of photoresist 710 disposed thereon that has been patterned using a lithography system of an embodiment of the present invention. FIG. 8*b* shows the semiconductor device 70 of FIG. 8*a* after the layer of photoresist 710 has been used as a mask to pattern a material layer 720 of the semiconductor device 70.

Referring to FIG. 8*a*, the semiconductor device 70 includes a workpiece 730. The workpiece 730 may be held to a wafer support 60. The workpiece 730 may include a semiconductor substrate comprising silicon or other semiconductor materials covered by an insulating layer, for example. The workpiece 730 may also include other active components or circuits (not shown). The workpiece 730 may comprise silicon oxide over single-crystal silicon, for example. The workpiece 730 may include other conductive layers or other semiconductor elements, e.g., transistors, diodes, etc. Compound semiconductors, GaAs, InP, Si/Ge, or SiC, as examples, may be used in place of silicon. The workpiece 730 may comprise a silicon-on-insulator (SOI) substrate, for example.

An embodiment of the present invention describes a method using the lithography systems shown in FIG. 2 and the masks of FIG. 3 or 5 to fabricate a semiconductor device 70. A sequence of process steps used in the formation of the semiconductor device 70 will now be described. A material layer 720 to be patterned is deposited over the workpiece 730. The material layer 720 may comprise a conductive, insulating, or semiconductive material, or multiple layers or combinations thereof, as examples. In some embodiments, the material layer 720 preferably comprises a semiconductive material such as silicon or polysilicon, for example, although other materials may also be used. In an embodiment where transistors are formed, the material layer 720 may comprise a gate dielectric material comprising an insulator and a gate material formed over the gate dielectric material, for example.

A layer of photosensitive material 710 is deposited over the material layer 720. The layer of photosensitive material 710 may comprise a photoresist, for example. The layer of photosensitive material 710 is patterned using the lithography masks 17 and 27 of e.g., FIG. 3 to form a latent pattern comprising a plurality of features 711 and 712 to be formed in the material layer 720. The layer of photosensitive material 710 is developed, as shown in FIG. 8*a*.

In some embodiments, the layer of photosensitive material 710 is used as a mask while the material layer 720 is etched using an etch process, forming a plurality of features 711 and 712 in the material layer 720, as shown in a cross-sectional view in FIG. 8*b*. The layer of photosensitive material 710 is then removed. The plurality of features in the material layer 720 may be contact holes, metal lines, via holes, gate lines, dummy gate lines, features for patterning isolation trench, etc.

In other embodiments, the layer of photosensitive material 710 is used as a mask to affect an underlying material layer 720 of the semiconductor device 70, for example. Affecting the material layer 720 may comprise etching away uncovered portions of the material layer 720, implanting a substance such as a dopant or other materials into the uncovered portions of the material layer 720, or forming a second material layer over uncovered portions of the material layer 720, as examples (not shown), although alternatively, the material layer 720 may be affected in other ways. Further processing of the workpiece 730, using conventional semiconductor manufacturing techniques, forms the semiconductor device 70.

Features of semiconductor device 70, manufactured using the novel methods described herein, may comprise transistor gates, conductive lines, vias, capacitor plates, and other features, as examples. Embodiments of the present invention may be used to pattern features of memory devices, logic circuitry, and/or power circuitry, as examples, although other types of ICs and devices may also be fabricated using the manufacturing techniques and processes described herein.

Although embodiments of this invention have been described using coherent illumination, in some embodiments, some deviation from coherence may be allowed. For example, a partial coherence may also be used in various embodiments.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a semiconductor device, the method comprising:
    forming an integrated circuit by forming a pattern comprising a first feature and a neighboring second feature on a semiconductor body, the integrated circuit being formed by simultaneously exposing a first mask and a second mask, wherein the first and the second features are formed at the same time during the simultaneous exposure, wherein a distance between the first and the second features is near a resolution limit of a optical system performing the exposing, wherein the first mask comprises transparent regions bounded by opaque regions, wherein the second mask comprises transparent regions bounded by phase shift regions, wherein boundaries of the pattern are formed by a superposition of a first light exposed by the transparent regions of the first mask with a second light exposed by the phase shift regions of the second mask, wherein center portions of the pattern are formed by a superposition of the first light exposed by the transparent regions of the first mask with a third light exposed by the transparent regions of the second mask, and wherein the second light is configured to destructively interfere with the first light.

2. The method of claim 1, wherein the pattern is formed by a superposition of electric fields.

3. The method of claim 1, wherein boundaries of the phase shift regions to the transparent regions of the second mask are misaligned relative to the boundaries of the transparent regions to the opaque regions of the first mask.

4. The method of claim 3, wherein the boundaries are misaligned to enhance an image slope along boundaries of the pattern formed.

5. The method of claim 1, wherein a dimension of one of the phase shift regions of the second mask is larger than a corresponding opaque region of the first mask.

6. The method of claim 1, wherein the first mask is a binary mask and the second mask is an attenuated phase shift mask.

7. The method of claim 1, wherein the first mask is oriented on a first plane and the second mask is oriented on a second plane, wherein the first plane and the second plane are not co-planar.

8. A method of forming a semiconductor device, the method comprising:
    simultaneously exposing a first mask and a binary mask, the first mask comprising target features, and the binary mask comprising assist holes, wherein the target features are formed at the same time during the simultaneous exposing, wherein a distance between the target features is near a resolution limit of a optical system performing the simultaneous exposing, wherein the assist holes are aligned relative to target features for preventing side lobes formed during exposure of the target features, wherein the first mask and the binary mask are aligned on planes that are different during the simultaneous exposure; and
    forming the target features by a superposition of a first light exposed by the first mask with a second light exposed by the binary mask, wherein the first light and the second light are phase shifted by 180 degrees, wherein center portions of the target features are formed by the first light, and wherein the second light passing through the assist holes destructively interferes with the first light thereby preventing side lobes formation.

9. The method of claim 8, wherein dimensions of the assist holes are adjusted to reduce side lobe formation.

10. The method of claim 8, wherein the second light is optimized for side lobe suppression.

11. The method of claim 10, wherein the optimization of the second light includes changing exposure dose, exposure intensity, polarization, and phase difference.

12. The method of claim 8, wherein the first mask and the binary mask are oriented along planes that are perpendicular to each other during the simultaneous exposure.

13. A method of forming a semiconductor device, the method comprising:
    exposing a first region of a first mask comprising a plurality of first features, the plurality of first features optimally exposed by a first process window, wherein all first features of the plurality of first features are formed at the same time during the exposing, and wherein a distance between the plurality of first features is near a resolution limit of a optical system performing the simultaneous exposing;
    simultaneously exposing a second region of a second mask comprising a plurality of second features, the plurality of second features optimally exposed by a second process window, wherein the first mask and the second mask are aligned on different planes when simultaneously exposing the first and the second regions; and
    forming a pattern on a semiconductor body by interference of light from the first mask and the second mask, wherein center portions of the pattern are formed by a superposition of a first light exposed by transparent regions of the first mask, wherein edges of the pattern are formed by a superposition of the first light exposed by transparent regions of the first mask with a second light exposed by the second mask, and wherein the second light is configured to destructively interfere with the first light.

14. The method of claim 13, wherein the first features comprise horizontal features and the second features comprise vertical features.

15. The method of claim 13, wherein the light from the first mask and the second mask are coherent.

16. The method of claim 13, wherein the second mask further comprises a back side polarizing rotation film.

17. The method of claim 16, wherein the back side polarizing rotation film rotates on a plane of polarization by 90 degrees.

18. The method of claim 13, wherein the first features comprise features to be printed on the semiconductor body.

19. The method of claim 18, wherein the second features comprise sub-resolution scatter bars that are not printed.

20. The method of claim 19, wherein the sub-resolution scatter bars are not constrained for space by the first features.

21. The method of claim 19, wherein the sub-resolution scatter bars are embedded in opaque regions.

22. The method of claim 13, wherein the first mask and the second mask are oriented along planes that are perpendicular to each other when simultaneously exposing the first and the second regions.

23. A method of forming a semiconductor device by forming a pattern on a semiconductor body, the method comprising:
    simultaneously exposing a first mask and a second mask, the first mask comprising transparent regions bounded by opaque regions, the second mask comprising transparent regions bounded by phase shift regions, wherein boundaries of the pattern are formed by a superposition of a first light exposed by the transparent regions of the first mask with a second light exposed by the phase shift regions of the second mask, wherein the first light and the second light are not different diffractive orders of a light beam, wherein center portions of the pattern are formed by a superposition of the first light exposed by the transparent regions of the first mask with a third light exposed by the transparent regions of the second mask, and wherein the second light is configured to destructively interfere with the first light, wherein the first mask comprises a first feature and a neighboring second feature, wherein the first and the second features are formed at the same time during the simultaneous exposure, wherein a distance between the first and the second features is near a resolution limit of a optical system performing the exposing.

* * * * *